United States Patent [19]
Kuno et al.

[11] Patent Number: 5,945,697
[45] Date of Patent: Aug. 31, 1999

[54] MOS TRANSISTOR AND CHARGE DETECTOR USING SAME

[75] Inventors: Yoshinori Kuno; Masahide Hirama, both of Kanagawa, Japan

[73] Assignee: Sonu Corporation, Tokyo, Japan

[21] Appl. No.: 08/190,244

[22] Filed: Jan. 31, 1994

Related U.S. Application Data

[63] Continuation of application No. 07/957,148, Oct. 7, 1992, abandoned.

[30] Foreign Application Priority Data

Oct. 8, 1991 [JP] Japan .................................. 3-290844

[51] Int. Cl.[6] ........................ H01L 27/148; H01L 29/768
[52] U.S. Cl. ............................................ 257/239; 257/243
[58] Field of Search .................................. 257/239, 243, 257/652, 400

[56] References Cited

U.S. PATENT DOCUMENTS

| 3,936,862 | 2/1976 | Moyle | 257/400 |
| 4,235,011 | 11/1980 | Butler et al. | 257/652 |
| 4,603,426 | 7/1986 | Sauer | 257/239 |
| 4,785,343 | 11/1988 | Nezu | 257/394 |
| 4,931,850 | 6/1990 | Yamada | 257/400 |
| 4,998,161 | 3/1991 | Kimura et al. | 257/394 |

FOREIGN PATENT DOCUMENTS

| 0023791 | 2/1981 | European Pat. Off. | 257/394 |
| 53-87679 | 2/1978 | Japan | 257/400 |
| 1239966 | 9/1989 | Japan | 257/394 |

*Primary Examiner*—Stephen D. Meier
*Attorney, Agent, or Firm*—Hill & Simpson

[57] ABSTRACT

A MOS transistor comprising channel stoppers formed of a first polysilicon layer to determine a channel width, and a gate electrode formed of a second polysilicon layer, wherein a bias voltage is applied to the channel stoppers. In a charge detector having a source follower circuit with a drive MOS transistor and a load MOS transistor for converting a transferred signal charge into a signal voltage, the MOS transistor of the invention is used as the drive transistor, and its source output voltage is fed back as a bias voltage to the channel stoppers, thereby minimizing both the DC bias variation in the output voltage of the source follower circuit and the nonuniformity in the conversion efficiency.

9 Claims, 3 Drawing Sheets

MOS TRANSISTOR AND CHARGE DETECTOR USING SAME

This is a continuation of application Ser. No. 07/957,148, filed Oct. 7, 1992 now abandoned.

BACKGROUND OF THE INVENTION

1. Field of the Invention

The present invention relates to a MOS transistor adapted for use particularly as a drive MOS transistor in a source follower circuit which constitutes a charge detector employed in an output of a charge transfer device.

2. Description of the Prior Art

In a CCD solid-state image sensing apparatus or the like using a charge transfer device, a floating diffusion type charge detector is employed in its output circuit. As shown in FIG. 5, such floating diffusion type charge detector has a source follower stage 51 for converting into a signal voltage the signal charge supplied from a horizontal shift register (charge transfer device) in the CCD solid-state image sensing apparatus to a floating diffusion region FD.

It is noted of late that the demand for a higher sensitivity of the CCD solid-state image sensing apparatus has been increasing year after year, and enhancement of the conversion efficiency in the charge detector is essential in realizing such higher sensitivity. For achieving a raised conversion efficiency of the charge detector, some requirements need to be satisfied including a reduced gate area in the drive MOS transistor Q1 of the source follower sage 51, i.e., a dimensional reduction of the drive MOS transistor Q1.

Generally a MOS transistor is produced, as shown in FIG. 6, by first growing a field oxide film ($SiO_2$) 12 to a thickness of several 100 nm on a silicon substrate 11, then etching predetermined portions for source, gate and drain electrodes, and after forming a gate electrode 14 of polysilicon, implanting impurity ions of a high concentration therein to form desired source and drain electrodes.

In such MOS transistor, its channel length L is determined by the width of the gate electrode 14 of polysilicon, while the channel width W is determined by the bottom width of the field oxide film 12, so that in the final product, the dimensional variation is rendered greater in the channel width W. Accordingly, with reduction of the gate area in the drive MOS transistor Q1 of the source follower stage 51 for the purpose of enhancing the conversion efficiency of the charge detector, such variation range comes to affect the operation ($I_D$-$V_D$ curve) of the MOS transistor to consequently vary the DC bias of the output voltage from the source follower stage 51, hence increasing the nonuniformity of the conversion efficiency.

OBJECTS AND SUMMARY OF THE INVENTION

It is an object of the present invention to provide an improved MOS transistor wherein the final precision obtained with a reduction of the gate area can be raised to eventually minimize both the DC bias variation in the output voltage of the source follower stage and the nonuniformity of the conversion efficiency.

And another object of the present invention resides in providing an improved charge detector which is employable in an output of a charge transfer device and uses such MOS transistor as a drive transistor in its source follower circuit to eliminate the known drawbacks mentioned.

According to one aspect of the present invention, there is provided a MOS transistor comprising a pair of channel stoppers formed of a first polysilicon layer to determine a channel width, and a gate electrode formed of a second polysilicon layer, wherein a bias voltage is applied to the channel stoppers.

According to another aspect of the invention, there is provided a charge detector for converting into a signal voltage the signal charge transferred thereto from a charge transfer device. The charge detector uses such MOS transistor of the above structure as a drive MOS transistor in a source follower circuit, wherein the source output voltage of the drive MOS transistor is fed back as a bias voltage to the channel stoppers.

In the MOS transistor where the channel stoppers are composed of polysilicon, the channel width can be determined by the polysilicon which is processable with a high precision, so that the dimensional variation caused in the channel width with a reduction of the gate area can be minimized.

Further in the floating diffusion type charge detector, the channel width is definable with a high precision in reducing the gate area due to the use of such MOS transistor in the source follower circuit, hence minimizing both the DC bias variation in the output voltage of the source follower circuit and the nonuniformity of the conversion efficiency.

The above and other features and advantages of the present invention will become apparent from the following description which will be given with reference to the illustrative accompanying drawings.

DESCRIPTION OF THE PREFERRED EMBODIMENTS

Hereinafter exemplary embodiments of the present invention will be described in detail with reference to the accompanying drawings.

Figure 1:
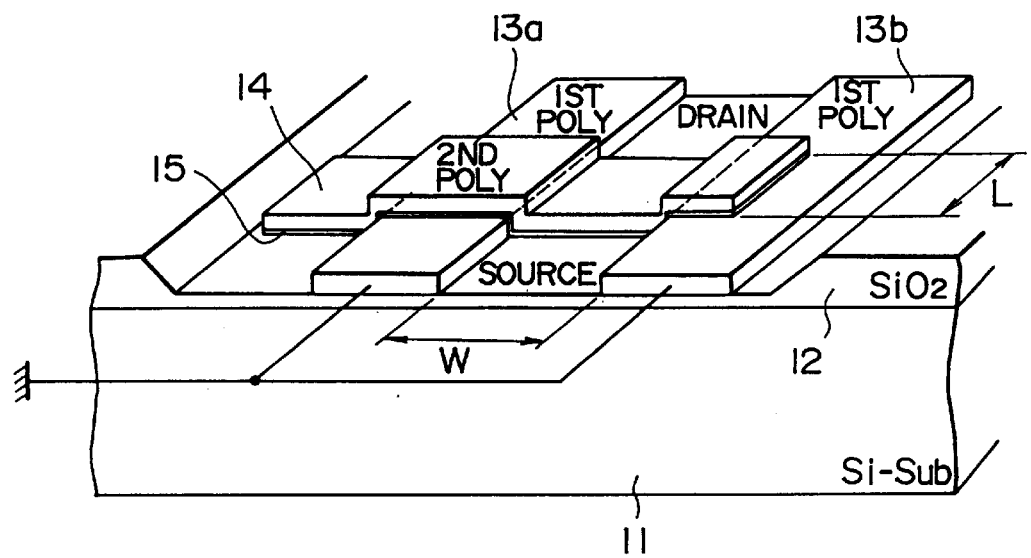
FIG. 1 schematically illustrates the structure of a first embodiment representing the MOS transistor of the present invention.

FIG. 1 shows the structure of a first embodiment representing the MOS transistor of the present invention. In this diagram, a field oxide film 12 is formed of silicon dioxide $SiO_2$ on a silicon substrate 11. Under the field oxide film 12, there are formed a pair of channel stoppers 13a, 13b which are composed of a first polysilicon layer (1st poly), and a channel width W is determined by the inner edges of the channel stoppers 13a, 13b. A ground level potential is applied as a bias voltage to the channel stoppers 13a, 13b so that the function thereof is completely performed.

Figure 2:
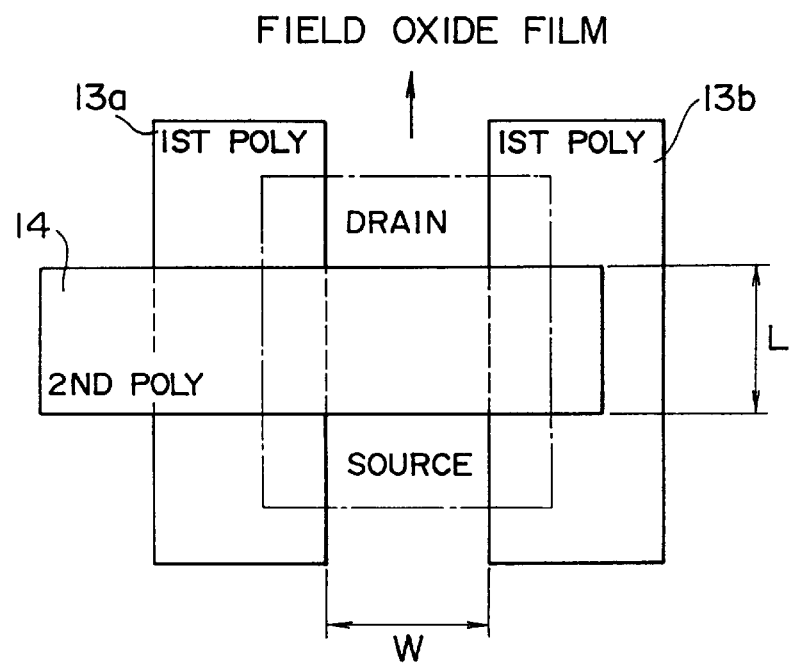
FIG. 2 shows a pattern of the MOS transistor according to the present invention.

A gate electrode 14 is formed of a second polysilicon layer (2nd poly) in the direction orthogonal to the channel stoppers 13a, 13b. And a channel length L is determined by the width of such gate electrode 14. An interlayer insulating film 15 is existent between the field oxide film 12, the channel stoppers 13a, 13b and the gate electrode 14. FIG. 2 shows the pattern of the MOS transistor having the structure mentioned.

Since the channel stoppers 13a, 13b in the MOS transistor are composed of the first polysilicon layer as described, it becomes possible to determine the channel width W by the use of polysilicon which is processible with a high precision, hence achieving an advantage that minimizes the dimensional variation caused in the channel width W when the gate area is reduced. Namely, the precision of the channel width W can further be enhanced as compared with the known value deteriorated with a reduction of the gate area.

Figure 3:
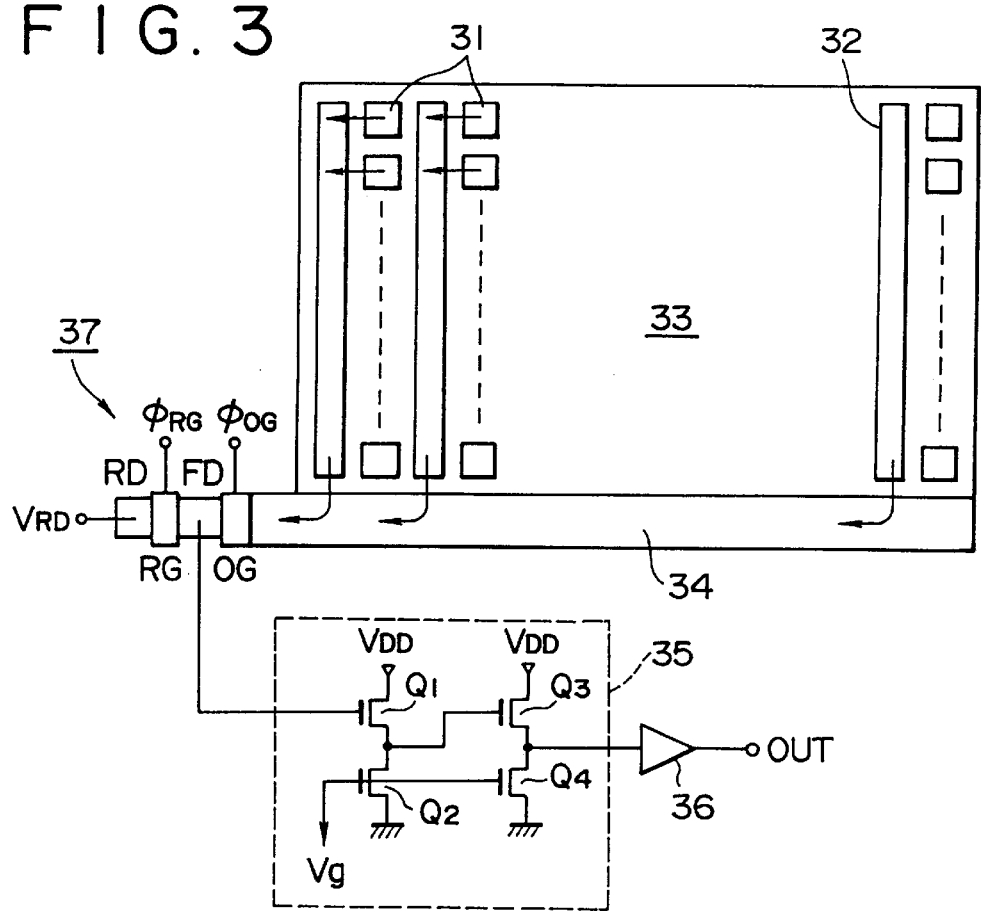
FIG. 3 shows the structure of an exemplary CCD solid-state image sensing apparatus equipped with a floating diffusion type charge detector in its output circuit.

FIG. 3 shows an exemplary constitution of an interline transfer type CCD solid-state image sensing apparatus employing, in its output circuit, a floating diffusion (FD) charge detector where the MOS transistor of the present invention is applied. In this diagram, an image pickup area 33 comprises a plurality of photo sensors 31 arranged two-dimensionally in conformity with individual pixels for storing signal charges corresponding to incident light, and vertical shift registers 32 arranged along the vertical rows of the photo sensors 31 for vertically transferring the signal charges read out from the photo sensors 31 momentarily during a portion of each vertical blanking interval.

The signal charges transferred to the vertical shift registers 32 are further transferred sequentially to a horizontal shift register 34 by a predetermined amount each time corresponding to one scanning line during a portion of the horizontal blanking interval. The signal charge of each scanning line is transferred via an output gate OG to the signal-detecting floating diffusion region FD by the horizontal shift register 34 in synchronism with the horizontal scanning period of the television signal. To the floating diffusion region FD, there is connected a source follower circuit 35 for converting the signal charge into a signal voltage.

The source follower circuit 35 has a two-stage constitution for example, which comprises a first stage consisting of a drive MOS transistor Q1 and a load MOS transistor Q2, and a second stage consisting of a drive MOS transistor Q3 and a load MOS transistor Q4. In this circuit configuration, a bias voltage Vg is applied to the gates of the load MOS transistors Q2, Q4 in the individual stages. The output of the source follower circuit 35 is delivered as a video signal output via a buffer 36. The floating diffusion region FD and the source follower circuit 35 constitute an FD charge detector 37.

In the FD charge detector 37, the MOS transistor of the present invention is used as the first-stage drive MOS transistor Q1 of the source follower circuit 35. As obvious from FIG. 1, the MOS transistor of the present invention is so constituted that the field oxide film 12 is positioned outside of the MOS transistor region, whereby the oxide film 12 between the channel stoppers 13a, 13b (of the first polysilicon layer) and the silicon substrate 11, and also between the channel stoppers 13a, 13b and the gate electrode 14 (of the second polysilicon layer), is formed to be thinner than the film in any conventional MOS transistor. Therefore, when the channel stoppers 13a, 13b are fixed at a DC bias, the capacitances thereof are rendered greater to consequently deteriorate the conversion efficiency.

Figure 4:
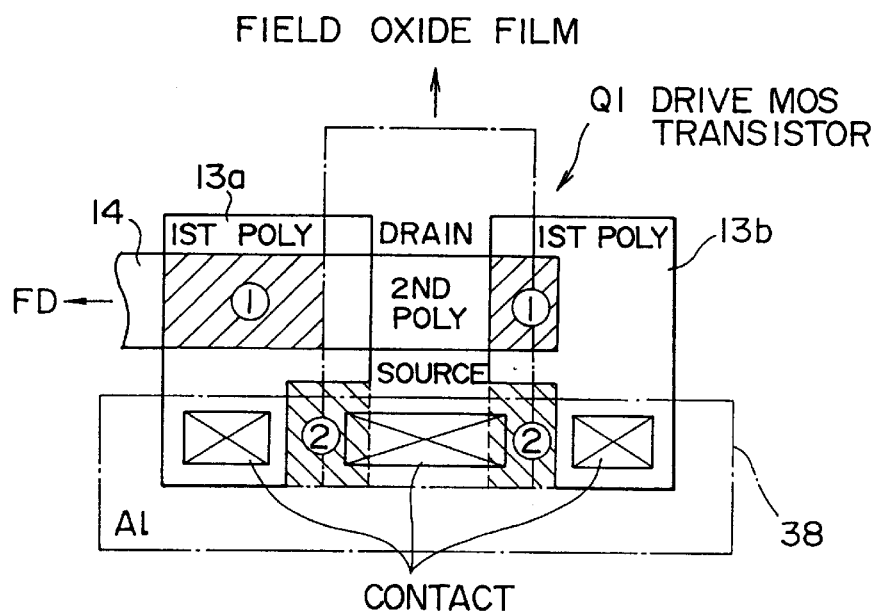
FIG. 4 shows a pattern of a second embodiment of the present invention.
Figure 5:
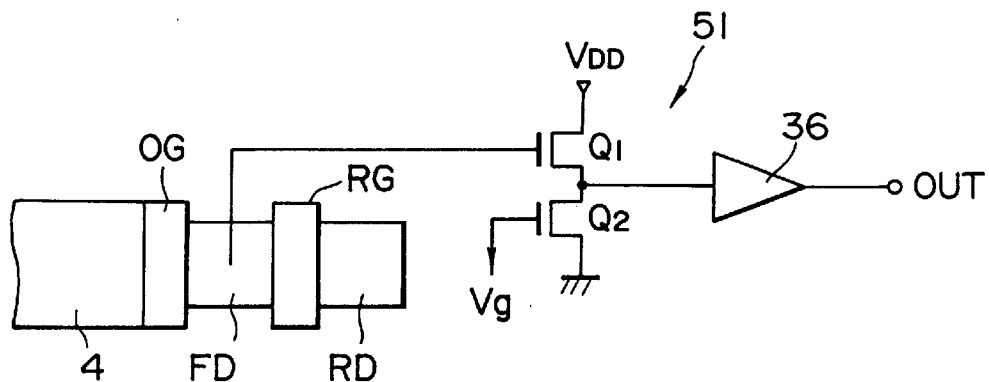
FIG. 5 shows the circuit configuration of the conventional floating diffusion type charge detector.
Figure 6:
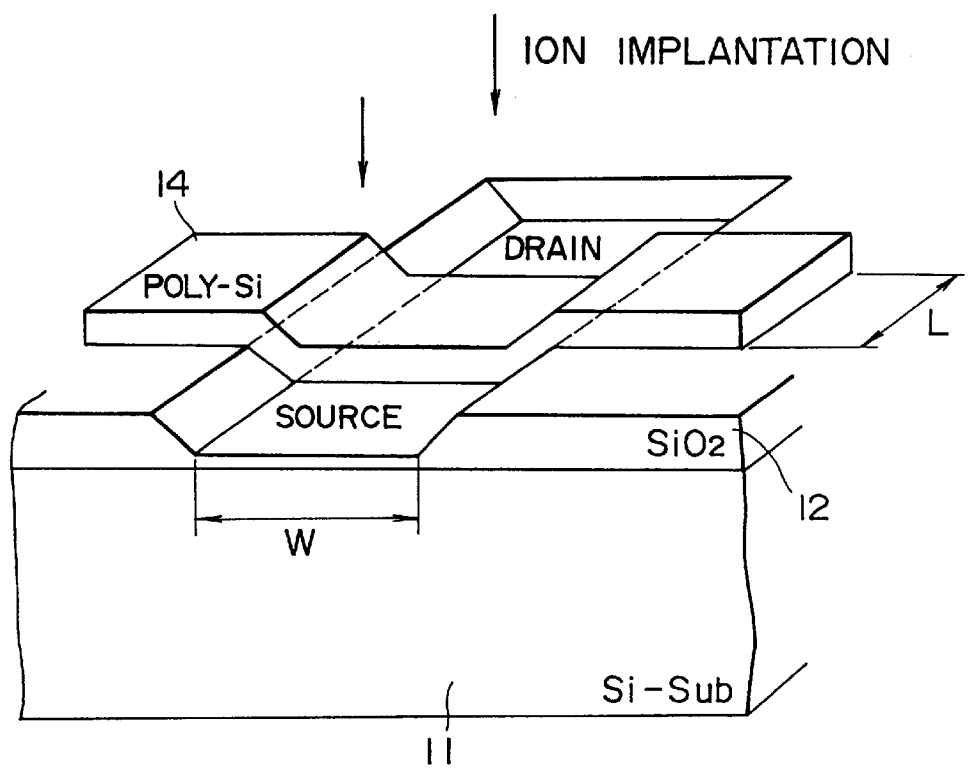
FIG. 6 schematically illustrates the structure of a conventional MOS transistor.

In view of such circumstance, the circuit configuration is so contrived as shown in FIG. 4, wherein the source of the drive MOS transistor Q1 is connected to the channel stoppers 13a, 13b through aluminum wires (Al) 38, and the output voltage from the source of the drive MOS transistor Q1 is fed back as a bias voltage to the channel stoppers 13a, 13b for driving the same in synchronism with the gate electrode 14. Then the capacitance of the hatched area (1) in FIG. 4 can be reduced to consequently prevent deterioration of the conversion efficiency derived from the capacitance.

The capacitance between the channel stoppers 13a, 13b and the silicon substrate 11 serves as a load to affect the frequency characteristic of the device as well, since the channel stoppers 13a, 13b are connected to the source of the drive MOS transistor Q1. Accordingly, it becomes possible to reduce the capacitance by cutting the channel stoppers 13a, 13b as denoted by hatched areas (2) in FIG. 4 and then wiring the channel stoppers 13a, 13b, which are existent on the drive MOS transistor Q1, onto the field oxide film 12, hence enhancing the frequency characteristic.

Thus, due to the contrivances of employing the MOS transistor of the present invention as the first-stage drive MOS transistor Q1 of the source follower circuit 35 and feeding back the source output voltage of the drive MOS transistor Q1 as a bias voltage to the channel stoppers 13a, 13b, the final precision of the finished product can be raised as described above when the gate area in the drive MOS transistor Q1 is reduced for the purpose of enhancing the conversion efficiency of the charge detector 37, thereby minimizing both the DC bias variation in the output voltage of the source follower circuit 35 and the nonuniformity of the conversion efficiency.

Furthermore, even if the designed dynamic range of the output circuit including the buffer 36 and so forth is narrow, it is still possible, due to the minimized variation and nonuniformity in manufacture, to easily enhance the sensitivity of the device by reducing the channel width W of the first-stage drive MOS transistor Q1 in the source follower circuit 35.

In the above embodiment, a description has been given with regard to an exemplary case of applying the present invention to an FD charge detector for use in an output circuit of a CCD solid-state image sensing apparatus. However, it is to be understood that the application of the present invention is not limited to such example alone, and the invention is applicable also to any general charge detector adapted for use in an output circuit of a charge transfer device with a CCD line (linear) sensor, a CCD delay element or the like.

As described hereinabove, according to the present invention where the channel stoppers of the MOS transistor are composed of polysilicon, the channel width W can be determined by the use of polysilicon processible with a high precision, to consequently ensure a remarkable effect in minimizing the dimensional variation caused in the channel width W with a reduction of the gate area.

Furthermore, since such MOS transistor is employed as the drive MOS transistor of the source follower circuit in the floating diffusion type charge detector, it becomes possible to define the channel width W with a high precision in the case of reducing the gate area, hence ensuring another effect that minimizes both the DC bias variation in the output voltage of the source follower circuit and the nonuniformity in the conversion efficiency.

What is claimed is:
1. A MOS transistor formed on a semiconductor substrate, comprising:
    a source diffusion region formed on the surface of said semiconductor substrate;
    a drain diffusion region formed on the surface of said semiconductor substrate at a position spaced apart from said source diffusion region;

a channel formed in the surface of said semiconductor substrate at a position between said source diffusion region and said drain diffusion region;

a first insulating layer formed on said semiconductor substrate;

a pair of channel stoppers formed in said first insulating layer at an adequate interval therebetween to determine the width of said channel, said pair of channel stoppers being composed of polysilicon;

a second insulating layer formed on said pair of channel stoppers;

a gate electrode formed on said channel and insulated therefrom by said first and/or second insulating layer while being insulated from said pair of channel stoppers by said second insulating layer; and said pair of channel stoppers being electrically connected to the said source diffusion region to drive said channel stoppers in synchronism with said gate electrode.

2. The MOS transistor according to claim 1, wherein said pair of channel stoppers is connected to said source diffusion region via a conductor.

3. The MOS transistor according to claim 1 wherein an output voltage of said MOS transistor is provided for said channel stoppers.

4. A charge detector formed on a semiconductor substrate, comprising:

a drive MOS transistor having gate, source and drain electrodes; and a load means where in the drain and source electrodes of said drive MOS transistor are connected between a DC voltage source and a reference point through said load means, and the gate of said drive MOS transistor receives a signal charge;

and said drive MOS transistor comprises a source diffusion region formed on the surface of said semiconductor substrate;

a drain diffusion region formed on the surface of said semiconductor substrate at a position spaced apart from said source diffusion region;

a channel formed in the surface of said semiconductor substrate at a position between said source diffusion region and said drain diffusion region;

a first insulating layer formed on said semiconductor substrate;

a pair of channel stoppers formed on said first insulating layer at an adequate interval therebetween to determine the width of said channel, said pair of channel stoppers being composed of polysilicon;

a second insulating layer formed on said pair of channel stoppers;

a gate electrode formed on said channel and insulating therefrom by said first and/or second insulating layer while being insulated from said pair of channel stoppers by said second insulating layer; and said pair of channel stoppers being electrically connected to said source diffusion region so that said channel stoppers are drive in synchronism with said gate electrode.

5. The charge detector according to claim 4, wherein said drive MOS transistor is connected to a source follower circuit.

6. The charge detector according to claim 4, wherein said pair of channel stoppers are connected to said source diffusion region via a connector.

7. The charge detector according to claim 4 wherein an output voltage of said drive MOS transistor is provided for said channel stoppers.

8. A solid-state image sensing apparatus formed on a semiconductor substrate, comprising:

image pickup means for receiving incident light and producing signal charges corresponding to the amount of said incident light;

a charge detector detecting said signal charges said charge detector comprising a drive MOS transistor having gate, source and drain electrodes; and a load means; wherein the drain and source electrodes of said drive MOS transistor are connected between a DC voltage source and a reference pint through said load means, and the gate of said drive MOS transistor receives said signal charges:

said drive MOS transistor comprises a source diffusion region formed on the surface of said semiconductor substrate; and drain diffusion region formed on the surface of said semiconductor substrate at a position spaced apart from said source diffusion region;

a channel formed in the surface of said semiconductor substrate at a position between said source diffusion region and said drain diffusion region;

a first insulating layer formed on said semiconductor substrate; a pair of channel stoppers formed on sid first insulating layer at a interval therebetween to determine the width of said channel, said pair of channel stoppers being composed of polysilicon;

a second insulating layer formed on said pair of channel stoppers;

a gate electrode formed on said channel and insulated from said channel by said first and/or second insulating layer while being insulated from said pair of channel stoppers by said second insulating layer; and said pair of channel stoppers being electrically connected to said source diffusion region so that said channel stoppers are driven in synchronism with said gate electrode.

9. The solid-state image sensing apparatus according to claim 8 wherein an output voltage of said drive MOS transistor is provided for said channel stoppers.

* * * * *